US012805206B2

(12) United States Patent
Kim et al.

(10) Patent No.: US 12,805,206 B2
(45) Date of Patent: Nov. 17, 2026

(54) VARIABLE RESISTANCE MEMORY DEVICE AND ELECTRONIC APPARATUS INCLUDING THE SAME

(71) Applicant: SAMSUNG ELECTRONICS CO., LTD., Suwon-si (KR)

(72) Inventors: Yumin Kim, Suwon-si (KR); Seyun Kim, Suwon-si (KR); Garam Park, Suwon-si (KR); Hyunjae Song, Suwon-si (KR); Seungyeul Yang, Suwon-si (KR); Seungdam Hyun, Suwon-si (KR); Jooheon Kang, Suwon-si (KR); Jinwoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 640 days.

(21) Appl. No.: 18/214,755

(22) Filed: Jun. 27, 2023

(65) Prior Publication Data

US 2024/0196763 A1 Jun. 13, 2024

(30) Foreign Application Priority Data

Dec. 13, 2022 (KR) ........................ 10-2022-0174186

(51) Int. Cl.
*H10N 70/00* (2023.01)
*H10B 63/00* (2023.01)

(52) U.S. Cl.
CPC ........... *H10N 70/826* (2023.02); *H10B 63/84* (2023.02); *H10N 70/8833* (2023.02)

(58) Field of Classification Search
CPC .. H10N 70/826; H10N 70/8833; H10N 70/24; H10N 70/823; H10N 70/883; H10B 63/84; H10B 63/34; H10B 63/845
See application file for complete search history.

(56) References Cited

U.S. PATENT DOCUMENTS 8,829,590 B2 9/2014 Park
9,966,136 B2 5/2018 Ogiwara et al.
(Continued)

FOREIGN PATENT DOCUMENTS

JP 2013-45954 A 3/2013
KR 10-2022-0059294 A 5/2022
KR 10-2024-0026063 A 2/2024

OTHER PUBLICATIONS

Wan, H. J. et al., "In Situ Observation of Compliance-Current Overshoot and Its Effect on Resistive Switching", IEEE Electron Device Letters, vol. 31, No. 3. Mar. 2010, pp. 246-248. (3 pages total).

(Continued)

*Primary Examiner* — Shih Tsun A Chou
(74) *Attorney, Agent, or Firm* — Sughrue Mion, PLLC

(57) ABSTRACT

A variable resistance memory device includes a pillar, a resistance change layer provided at a side surface of the pillar, a semiconductor layer provided at a side surface of the resistance change layer, a gate insulating layer provided at a side surface of the semiconductor layer, a plurality of isolating layers and a plurality of gate electrodes alternately arranged along a surface of the gate insulating layer, and an internal resistance layer between the resistance change layer and the semiconductor layer, where a resistance of the internal resistance layer is greater than a resistance of the semiconductor layer when the semiconductor layer includes conductor characteristics and the resistance of the internal resistance layer is less than the resistance of the semiconductor layer when the semiconductor layer includes insulator characteristics.

18 Claims, 19 Drawing Sheets

(56) References Cited

U.S. PATENT DOCUMENTS

| | | | | |
|---|---|---|---|---|
| 11,322,544 | B2 | 5/2022 | Lee et al. | |
| 2009/0272962 | A1* | 11/2009 | Kumar | H10N 70/026 257/43 |
| 2013/0048938 | A1* | 2/2013 | Shintani | H10B 63/84 257/4 |
| 2016/0336066 | A1* | 11/2016 | Lin | G11C 13/0064 |
| 2020/0266345 | A1 | 8/2020 | Yoon et al. | |
| 2021/0035635 | A1 | 2/2021 | Yoon et al. | |
| 2021/0035641 | A1 | 2/2021 | Yoon et al. | |
| 2021/0202833 | A1 | 7/2021 | Kim et al. | |
| 2021/0202840 | A1 | 7/2021 | Kim et al. | |
| 2021/0217473 | A1 | 7/2021 | Cho et al. | |
| 2022/0020437 | A1 | 1/2022 | Kim et al. | |
| 2022/0020818 | A1 | 1/2022 | Kim et al. | |
| 2022/0052259 | A1 | 2/2022 | Kim et al. | |
| 2022/0077235 | A1 | 3/2022 | Kim et al. | |
| 2022/0093685 | A1 | 3/2022 | Kamata et al. | |
| 2022/0140234 | A1* | 5/2022 | Han | H10N 70/826 257/4 |
| 2022/0246679 | A1 | 8/2022 | Cho et al. | |
| 2022/0302380 | A1 | 9/2022 | Mizusaki et al. | |
| 2022/0310827 | A1 | 9/2022 | Kim et al. | |
| 2022/0384724 | A1 | 12/2022 | Chen et al. | |
| 2023/0093892 | A1 | 3/2023 | Kim et al. | |
| 2024/0065001 | A1 | 2/2024 | Kim et al. | |

OTHER PUBLICATIONS

Schonhals, Alexander et al., "Improvement of SET variability in TaOx based resistive RAM devices", Nanotechnology, vol. 28, No. 465203, Oct. 23, 2017. (8 pages total).

Kim, Kyung Min et al., "Voltage divider effect for the improvement of variability and endurance of TaOx memristor", Scientific Reports, Feb. 2, 2016. (6 pages total).

Hardtdegen, Alexander et al., "Improved Switching Stability and the Effect of an Internal Series Resistor in HfO2/TiOx Bilayer ReRAM Cells", IEEE Transactions on Electron Devices, vol. 65, No. 8, Aug. 2018, pp. 3229-3236. (8 pages total).

Communication issued on Mar. 27, 2026 by the Korean Ministry of Intellectual Property (MOIP) in Korean Patent Application No. 10-2022-0174186.

* cited by examiner

FIG. 5

| Oxygen Deficient Ratio (%) | COMPOSITION | R (MΩ) |
|---|---|---|
| 2.1 | HfOx | 0.74 |
| 6.88 | TaSiO (Si 27at%) | 0.5 |
| 9.91 | TaAlO (Al 35at%) | 0.35 |
| 12.13 | TaSiO (Si 12at%) | 0.155 |
| 13.57 | TaHfO (Hf 32at%) | 0.22 |
| 13.89 | TaSiO (Si 5at%) | 0.128 |
| 13.93 | TaAlO (Al 12at%) | 0.095 |
| 15.19 | TaAlO (Al 5at%) | 0.13 |
| 15.74 | TaHfO (Hf 5at%) | 0.15 |
| 16.5 | TaOx | 0.165 |

VARIABLE RESISTANCE MEMORY DEVICE AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2022-0174186, filed on Dec. 13, 2022, in the Korean Intellectual Property Office, the disclosure of which is incorporated by reference herein in its entirety.

BACKGROUND

1. Field

The disclosure relates to a memory device including a variable resistance material and an electronic apparatus including the memory device.

2. Description of Related Art

A variable resistance memory device is a type of a semiconductor memory device that includes a plurality of memory cells capable of retaining information even when power supply is interrupted and may enable the stored information to be used again when power is restored. Variable resistance memory devices may be used in a wide range of electronics, including mobile phones, digital cameras, personal digital assistants (PDAs), mobile computer apparatuses, stationary computer apparatuses, and other apparatuses.

Recently, research has been actively conducted to apply such devices to chips for forming next-generation neuromorphic computing platforms or neural networks.

SUMMARY

Provided are a variable resistance memory device including an internal resistance layer that may prevent an overcurrent and an overvoltage from being applied to a resistance change layer and an electronic apparatus including the variable resistance memory device.

Provided are a variable resistance memory device including a resistance change layer that may generate a large number of oxygen vacancies therein and an electronic apparatus including the variable resistance memory device.

Additional aspects will be set forth in part in the description which follows and, in part, will be apparent from the description, or may be learned by practice of the presented embodiments of the disclosure.

According to an aspect of the disclosure, a variable resistance memory device may include a pillar, a resistance change layer provided at a side surface of the pillar, a semiconductor layer provided at a side surface of the resistance change layer, a gate insulating layer provided at a side surface of the semiconductor layer, a plurality of isolating layers and a plurality of gate electrodes alternately arranged along a surface of the gate insulating layer, and an internal resistance layer between the resistance change layer and the semiconductor layer, where a resistance of the internal resistance layer may be greater than a resistance of the semiconductor layer when the semiconductor layer includes conductor characteristics and the resistance of the internal resistance layer may be less than the resistance of the semiconductor layer when the semiconductor layer includes insulator characteristics.

The resistance of the internal resistance layer may be 0.35 MΩ to 600 MΩ.

An oxygen deficient ratio of the internal resistance layer may be less than an oxygen deficient ratio of the resistance change layer.

An oxygen deficient ratio of the internal resistance layer may be less than about 10%.

An oxygen deficient ratio of the resistance change layer may be about 10% or more.

The internal resistance layer may include an oxide including at least one of hafnium (Hf), aluminum (Al), silicon (Si), niobium (Nb), lanthanum (La), zirconium (Zr), scandium (Sc), tungsten (W), vanadium (V), and molybdenum (Mo).

The resistance change layer may include an oxide including at least one of tantalum (Ta), titanium (Ti), stannum (Sn), chromium (Cr), and manganese (Mn).

The internal resistance layer may include a first element at a first content and the resistance change layer may include the first element at a second content different from the first content.

The first element may include any one of hafnium (Hf), aluminum (Al), silicon (Si), niobium (Nb), lanthanum (La), zirconium (Zr), scandium (Sc), tungsten (W), vanadium (V), or molybdenum (Mo).

The first content of the first element in the internal resistance layer may be greater than the second content of the first element in the resistance change layer.

The internal resistance layer further may include a second element at a third content and the resistance change layer may include the second element at a fourth content different from the third content.

The second element may include any one of tantalum (Ta), titanium (Ti), stannum (Sn), chromium (Cr), or manganese (Mn).

The third content of the second element in the internal resistance layer may be less than the fourth content of the second element in the resistance change layer.

An operation voltage with an absolute value of 6 V or less may be applied to the semiconductor layer.

A thickness of the internal resistance layer may be less than a thickness of the resistance change layer.

The thickness of the internal resistance layer may be about 1 nm to about 10 nm.

A pitch between the plurality of gate electrodes may be about 20 nm or less.

The pillar may include an insulating material.

The pillar may include a conductive material.

According to an aspect of the disclosure, a method of forming a variable resistance memory device may include alternately stacking a first insulating material layer and a second insulating material layer on a substrate, forming a channel hole passing through the first insulating material layer and the second insulting material layer, forming a gate insulating layer in the channel hole, forming a semiconductor layer on the gate insulating layer and in the channel hole, and forming an internal resistance layer on the semiconductor layer and in the channel hole, where a resistance of the internal resistance layer may be less than a resistance of the semiconductor layer when the semiconductor layer includes conductor characteristics and the resistance of the internal resistance layer may be greater than the resistance of the semiconductor layer when the semiconductor layer includes insulator characteristics.

The method may include exposing the gate insulating layer by removing the second insulating material layer and forming a gate electrode in an area where the gate insulating layer is exposed.

The first insulating material layer may include a first material and wherein the second insulating material layer may include a second material that is different from the first material.

The resistance of the internal resistance layer may be 0.35 MΩ to 600 MΩ.

The method may include forming a resistance change layer on the internal resistance layer and in the channel hole, such that the internal resistance layer is arranged between the semiconductor layer and the resistance change layer.

An oxygen deficient ratio of the resistance change layer may be about 10% or more.

An oxygen deficient ratio of the internal resistance layer may be less than an oxygen deficient ratio of the resistance change layer.

An oxygen deficient ratio of the internal resistance layer may be less than about 10%.

BRIEF DESCRIPTION OF DRAWINGS

The above and other aspects, features, and advantages of certain embodiments of the disclosure will be more apparent from the following description taken in conjunction with the accompanying drawings, in which:

FIG. 5 is a table illustrating the relationship between the oxygen deficient ratio and the resistance of an oxide according to an embodiment;

DETAILED DESCRIPTION

Figure 1:
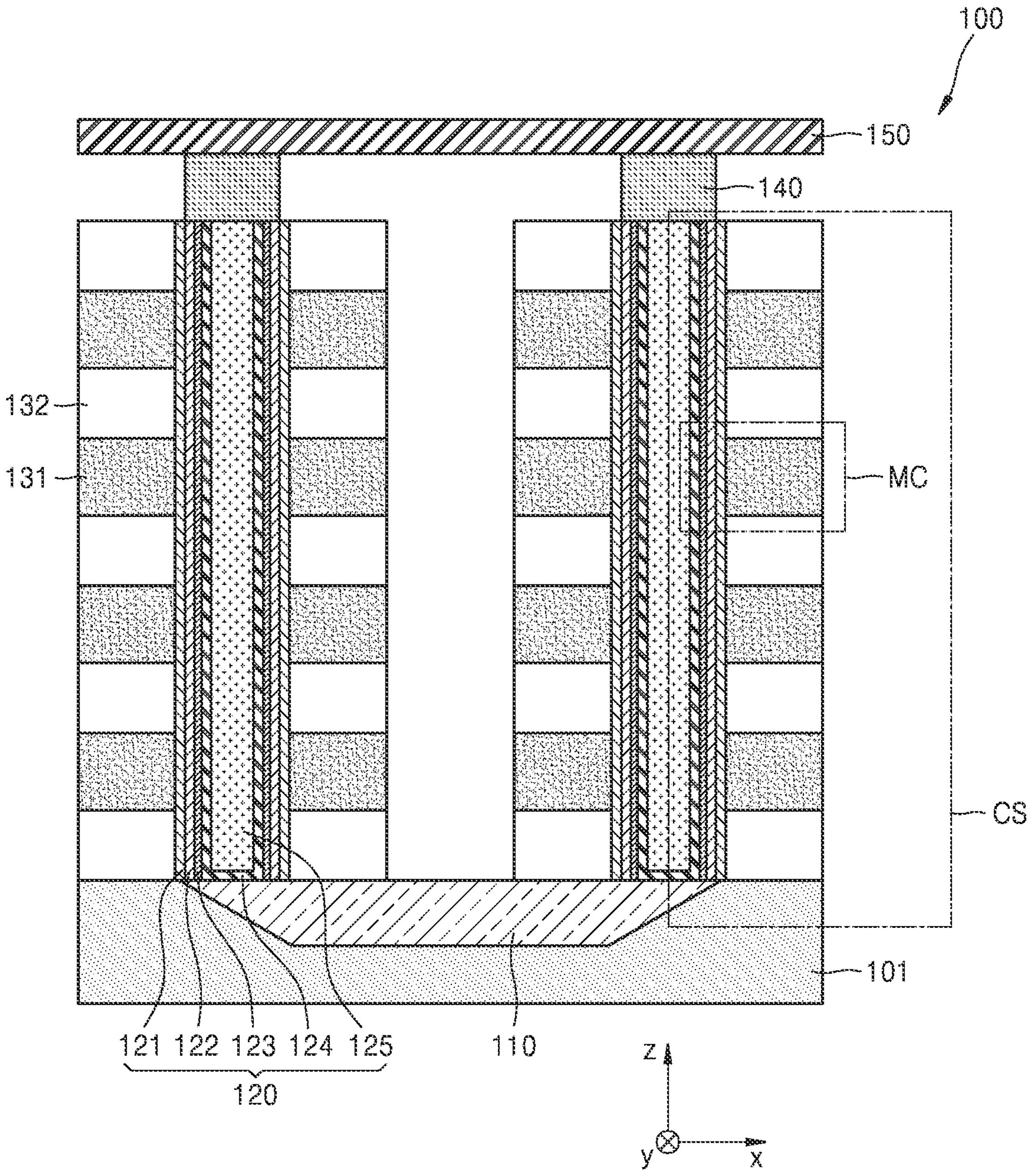
FIG. 1 is a cross-sectional view illustrating a schematic structure of a variable resistance memory device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The phrases "in some embodiments" or "in an embodiment" appearing in various places in the specification may not necessarily all refer to the same embodiment.

Some embodiments of the disclosure may be represented in terms of functional block components and various processing operations. Some or all of these functional blocks may be implemented by any number of hardware and/or software components that execute particular functions. For example, the functional blocks of the disclosure may be implemented by one or more microprocessors or may be implemented by circuit components for a certain function. Also, for example, the functional blocks of the disclosure may be implemented in various programming or scripting languages. The functional blocks may be implemented by an algorithm that is executed in one or more processors. Also, the disclosure may employ the related art for electronic environment setting, signal processing, and/or data processing. Terms such as "mechanism," "element," "unit," and "configuration" may be used in a broad sense, and are not limited to mechanical and physical configurations.

Connection lines or connection members between components illustrated in the drawings are merely examples of functional connections and/or physical or logical connections. In an actual apparatus, connections between components may be represented by various functional connections, physical connections, or logical connections that may be replaced or added.

The term such as "comprise" or "include" used herein should not be construed as necessarily including all of the elements or operations described herein, and should be construed as not including some of the described elements or operations or as further including additional elements or operations.

As used herein, the term "over" or "on" may include not only "directly over" or "directly on" but also "indirectly over" or "indirectly on". The term "and/or" may include any and all combinations of one or more of the associated listed items.

Expressions such as "at least one of," when preceding a list of elements, modify the entire list of elements and do not modify the individual elements of the list. For example, an expression such as "at least one of A, B, and C" or "at least one selected from the group consisting of A, B, and C" may be interpreted as only A, only B, only C, or any combination of two or more of A, B, and C, such as A, B, and C, A and B, B and C, and A and C.

When the term "about" or "substantially" is used in relation to a numerical value, the numerical value may be interpreted as including manufacturing or operating deviations (e.g., ±10%) around the numerical value. Also, when the term "generally" or "substantially" is used in relation to a geometric shape, it may be intended that a geometric accuracy is not required and a tolerance of the shape is within the scope of the present embodiments. Also, regardless of whether a numerical value or a shape is modified by the term “about” or “substantially,” the numerical value or the shape may be interpreted as including manufacturing or operating deviations (e.g., ±10%) around the numerical value or the shape.

Although terms such as “first” and “second” may be used herein to describe various elements or components, these elements or components should not be limited by these terms. These terms are only used to distinguish one element or component from another element or component.

Hereinafter, embodiments of the disclosure will be described in detail merely as examples with reference to the accompanying drawings.

Hereinafter, the disclosure will be described in detail with reference to the accompanying drawings.

Figure 2:
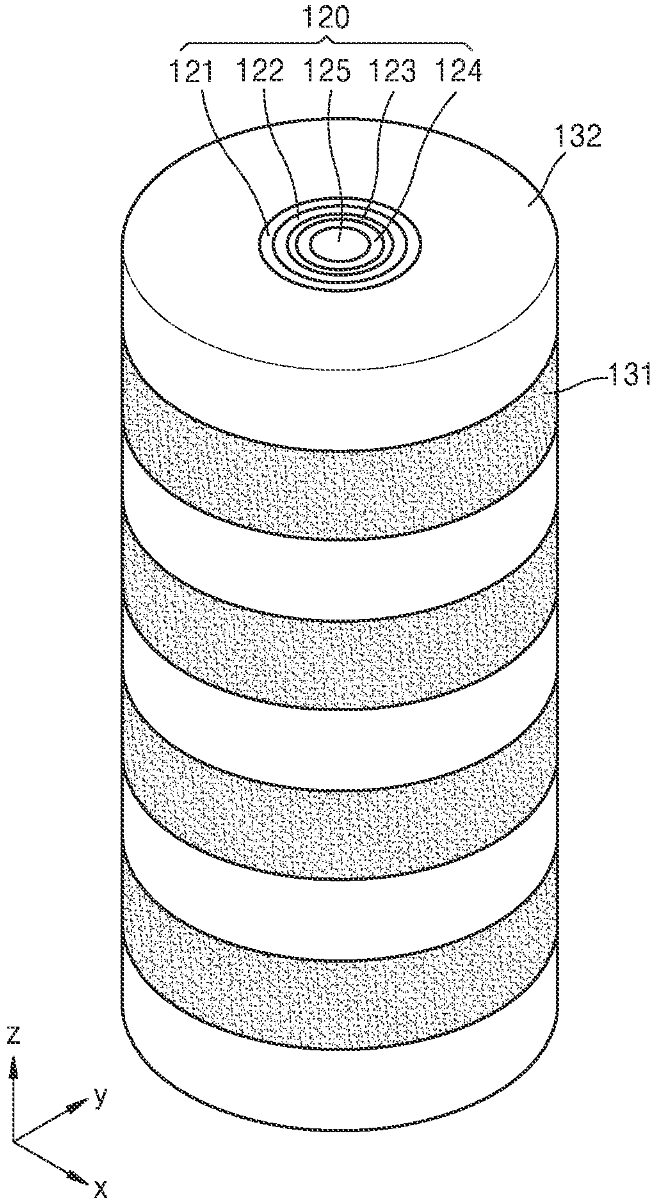
FIG. 2 is a diagram illustrating a schematic structure of a memory string included in the variable resistance memory device of FIG. 1 according to an embodiment.
Figure 3:
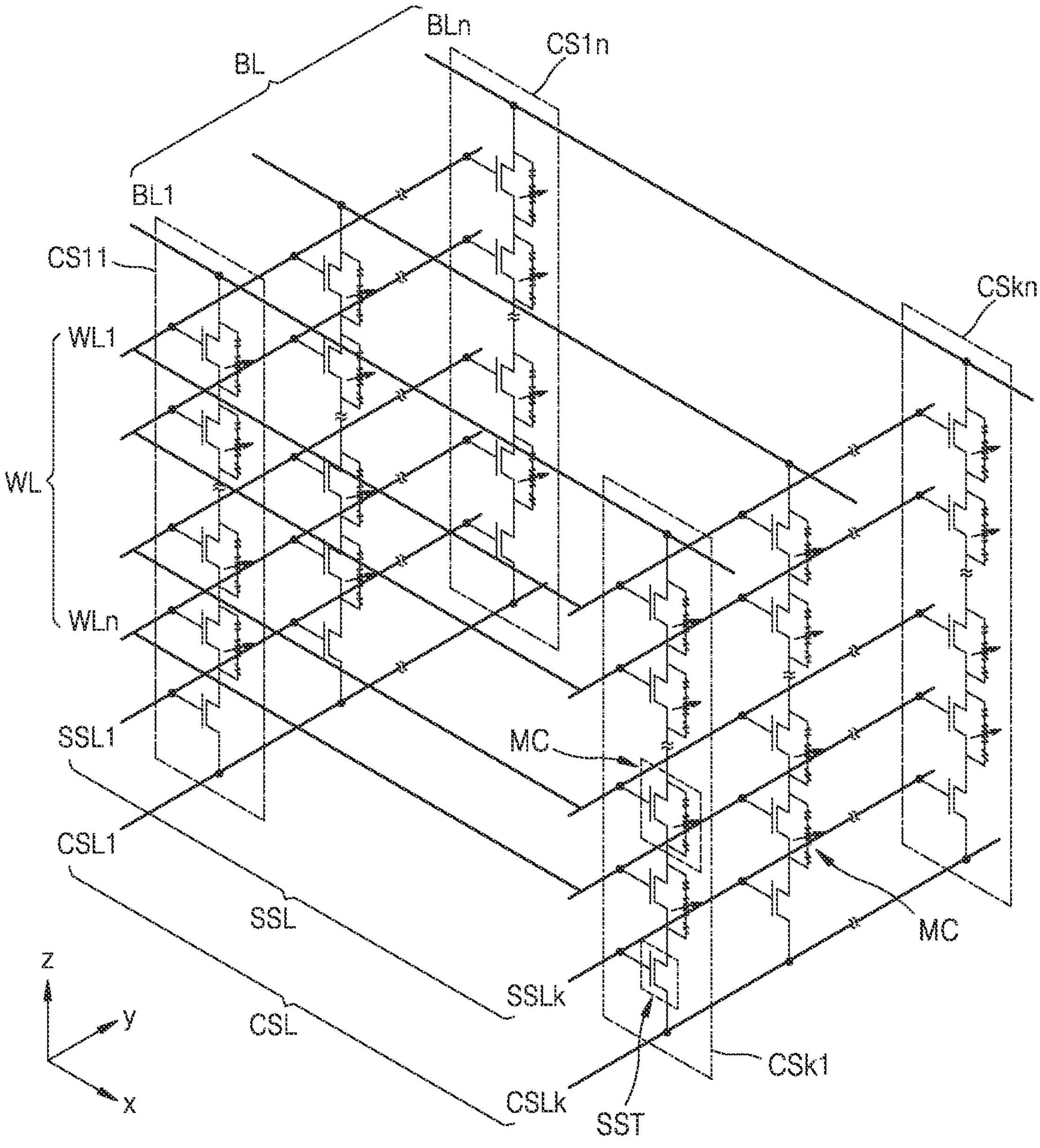
FIG. 3 is a diagram illustrating a memory apparatus including the variable resistance memory device of FIG. 1 according to an embodiment.
Figure 4:
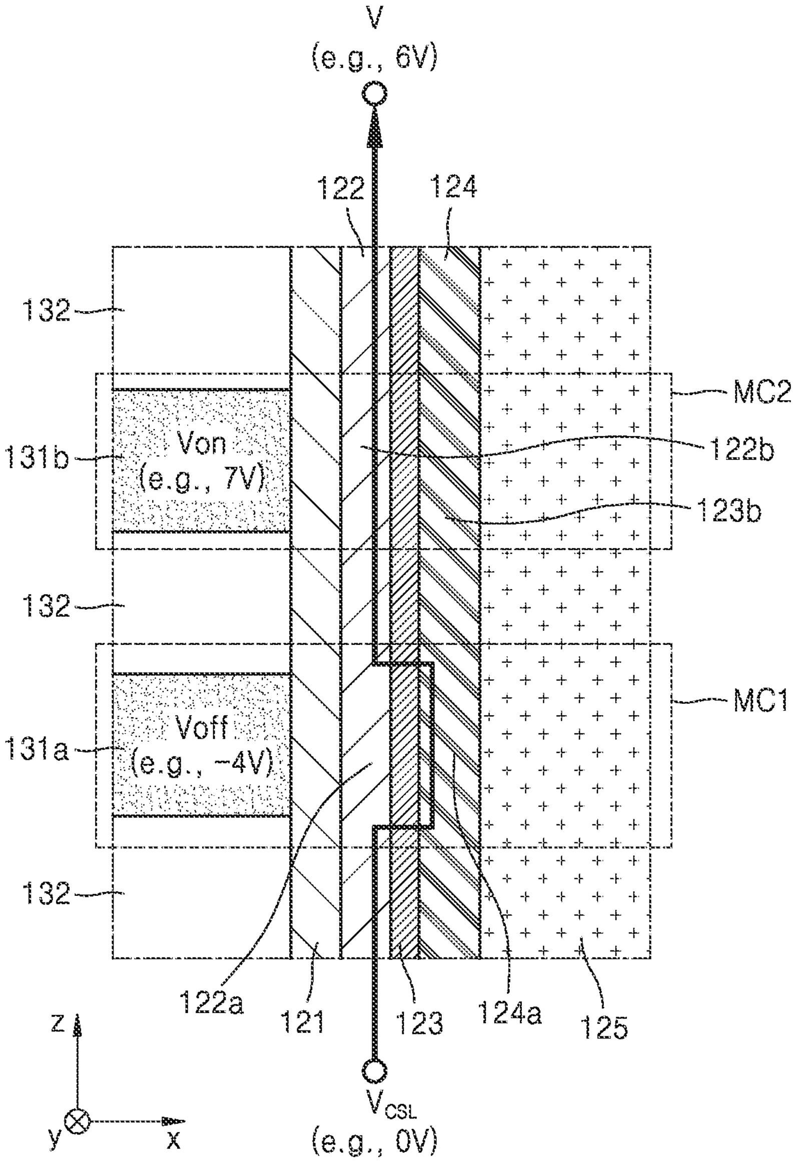
FIG. 4 is a diagram illustrating movement of oxygen vacancies in a resistance change layer as a portion of a variable resistance memory device according to an embodiment.

FIG. 1 is a cross-sectional view illustrating a schematic structure of a variable resistance memory device 100 according to an embodiment. FIG. 2 is a diagram illustrating a schematic structure of a memory string included in the variable resistance memory device 100 of FIG. 1 according to an embodiment. FIG. 3 is a diagram of a memory apparatus including the variable resistance memory device 100 of FIG. 1 according to an embodiment. FIG. 4 is a diagram illustrating movement of oxygen vacancies in a resistance change layer 124 as a portion of the variable resistance memory device 100 according to an embodiment.

The variable resistance memory device 100 according to an embodiment may be a vertical NAND (VNAND) memory in which a plurality of memory cells MC are arrayed in the vertical direction.

Referring to FIG. 1, a plurality of cell strings CS may be formed over a substrate 101.

The substrate 101 may include a silicon material doped with a first-type dopant, such as a p-type dopant. For example, the substrate 101 may include a p-type well (e.g., a pocket p-well). Hereinafter, it is assumed that the substrate 101 includes p-type silicon, although the substrate 101 is not limited to the p-type silicon.

A common source area 110 may be provided on the substrate 101. For example, the common source area 110 may have a second type different from the first type of the substrate 101. For example, the common source area 110 may have an n-type. Hereinafter, it is assumed that the common source area 110 has an n-type. However, the common source area 110 is not limited to the n-type. The common source area 110 may be connected to a common source line CSL.

The circuit diagram in FIG. 3 shows k*n cell strings CS that are arranged in a matrix form and are denoted by CSij ($1 \le l \le k$, $1 \le j \le n$) according to respective row and column positions of each cell string. Each cell string CSij may be connected to a bit line BL, a string selection line SSL, a word line WL, and a common source line CSL.

Each cell string CSij may include memory cells MC and a string selection transistor SST. The memory cells MC and the string selection transistor SST of each cell string CSij may be vertically stacked in the height direction.

The rows of the plurality of cell strings CS may be respectively connected to different string selection lines SSL1 to SSLk. For example, the string selection transistors SST of the cell strings CS11 to CS1*n* may be commonly connected to the string selection line SSL1. The string selection transistors SST of the cell strings CSk1 to CSkn may be commonly connected to the string selection line SSLk.

The columns of the plurality of cell strings CS may be respectively connected to different bit lines BL1 to BLn. For example, the memory cells MC and the string selection transistors SST of the cell strings CS11 to CSk1 may be commonly connected to the bit line BL1, and the memory cells MC and the string selection transistors SST of the cell strings CS1*n* to CSkn may be commonly connected to the bit line BLn.

The rows of the plurality of cell strings CS may be respectively connected to different common source lines CSL1 to CSLk. For example, the string selection transistors SST of the cell strings CS11 to CS1*n* may be commonly connected to the common source line CSL1, and the string selection transistors SST of the cell strings CSk1 to CSkn may be commonly connected to the common source line CSLk.

The memory cells MC located at the same height from the substrate 101 or the string selection transistors SST may be commonly connected to one word line WL, and the memory cells MC located at different heights may be respectively connected to different word lines WL1 to WLn.

The illustrated circuit structure is merely an example. For example, the number of the rows of the cell strings CS may increase or decrease. As the number of the rows of the cell string CS changes, the number of the string selection lines connected to the rows of the cell string CS and the number of the cell strings CS connected to one bit line 150 may also change. As the number of the rows of the cell strings CS changes, the number of the common source lines connected to the rows of the cell strings CS may also change.

The number of the columns of the cell strings CS may also increase or decrease. As the number of the columns of the cell string CS changes, the number of the bit lines 150 connected to the columns of the cell strings CS and the number of the cell strings CS connected to one string selection line may also change.

The height of the cell string CS may also increase or decrease. For example, the number of the memory cells MC stacked in each cell string CS may increase or decrease. As the number of the memory cells MC stacked in each cell string CS changes, the number of the word lines WL may also change. For example, the number of the string selection transistors provided in each of the cell strings CS may increase. As the number of the string selection transistors provided in each of the cell strings CS changes, the number of the string selection lines or the common source lines may also change. When the number of the string selection transistors increases, the string selection transistors may be stacked in the same form as the memory cells MC.

For example, writing and reading may be performed in units of rows of cell strings CS. The cell strings CS may be selected in units of one row by the common source line CSL, and the cell strings CS may be selected in units of one row by the string selection lines SSL. Also, a voltage may be applied to the common source lines CSL in units of at least two common source lines. A voltage may be applied to the common source lines CSL in units of all the common source lines.

In a selected row of the cell strings CS, writing and reading may be performed in units of pages. A page may be one row of memory cells connected to one word line WL. In a selected row of the cell strings CS, memory cells may be selected in units of pages by the word lines WL.

Referring back to FIGS. 1 and 2, the cell string CS may include a cylindrical channel hole 120 as well as a plurality of gate electrodes 131 and a plurality of isolating layers 132 surrounding the cylindrical channel hole 120 in a ring shape.

The plurality of gate electrodes 131 and the plurality of isolating layers 132 may be alternately stacked in the vertical direction (Z direction).

The gate electrode 131 may include a metal material or a heavily doped silicon material. Each gate electrode 131 may be connected to one of the word line WL and the string selection line SSL.

The isolating layer 132 may function as a spacer for insulation between conductive layers. The isolating layer 132 may include various insulating materials such as silicon oxide, or silicon nitride.

A channel hole 120 may be formed to pass through the gate electrode 131 and the isolating layer 132. The channel hole 120 may be formed to extend in a direction perpendicular or substantially perpendicular to the surface of the substrate 101 (i.e., the z-axis direction in FIG. 2). The channel hole 120 may be formed to have a circular cross-section.

The channel hole 120 may include a plurality of layers. The outermost layer of the channel hole 120 may be a gate insulating layer 121. For example, the gate insulating layer 121 may include various insulating materials such as silicon oxide, silicon nitride, or silicon oxynitride. The gate insulating layer 121 may be conformally deposited in the channel hole 120.

A semiconductor layer 122 may be conformally deposited along the inner surface of the gate insulating layer 121. The semiconductor layer 122 may include a first-type doped semiconductor material. The semiconductor layer 122 may include a silicon material doped in the same type as the substrate 101. For example, when the substrate 101 includes a p-type doped silicon material, the semiconductor layer 122 may also include a p-type doped silicon material. Alternatively, the semiconductor layer 122 may include a material such as Ge, IGZO, or GaAs.

An internal resistance layer 123 may be arranged along the inner surface of the semiconductor layer 122. The internal resistance layer 123 may be conformally deposited on the semiconductor layer 122. The resistance of the internal resistance layer 123 may be greater than the resistance of the semiconductor layer 122 when the semiconductor layer 122 has conductor characteristics and may be less than the resistance of the semiconductor layer 122 when the semiconductor layer 122 has insulator characteristics. The resistance of the internal resistance layer 123 may be greater than the resistance of a resistance change layer 124 when the resistance change layer 124 is in a low-resistance state and may be less than the resistance of the resistance change layer 124 when the resistance change layer 124 is in a high-resistance state. The internal resistance layer 123 may include an oxide with a low oxygen deficient ratio. The material of the internal resistance layer 123 will be described below.

A resistance change layer 124 may be arranged along the inner surface of the internal resistance layer 123. The resistance change layer 124 may be conformally deposited on the internal resistance layer 123. The resistance change layer 124 may change into a high-resistance state or a low-resistance state according to an applied voltage. The resistance change layer 124 may include an oxide with a high oxygen deficient ratio. The material of the resistance change layer 124 will be described below.

A pillar 125 may be arranged inside the resistance change layer 124. The pillar 125 may include, for example, silicon oxide or air but is not limited thereto.

The semiconductor layer 122 may contact a doped area (i.e., the common source area 110).

A drain 140 may be provided over the channel hole 120. The drain 140 may include a second-type doped silicon material. For example, the drain 140 may include an n-type doped silicon material.

A bit line 150 may be provided over the drain 140. The drain 140 and the bit line 150 may be connected through contact plugs.

Each gate electrode 131, as well as some areas of the gate insulating layer 121, the semiconductor layer 122, the internal resistance layer 123, and the resistance change layer 124 arranged in the horizontal direction (X direction) with respect thereto may constitute a memory cell MC. That is, the memory cell MC may have a circuit structure in which a transistor including the gate electrode 131 and the semiconductor layer 122 and the resistance change layer 124 are connected in parallel. Also, the internal resistance layer 123 and the resistance change layer 124 may be connected in series.

The memory cells MC may be consecutively arranged in the vertical direction (Z direction) to form a cell string CS. As illustrated in the circuit diagram of FIG. 3, both ends of the cell string CS may be connected to the common source line CSL and the bit line BL. By applying a voltage to the common source line CSL and the bit line BL, a program, read, or erase process may be performed on a plurality of memory cells MC.

An operation of the variable resistance memory device 100 will be described with reference to FIG. 4.

In order to select a memory cell, a turn-off voltage Voff may be applied to a gate electrode 131*a* of a selected memory cell MC1 and a turn-on voltage Von may be applied to a gate electrode 131*b* of an unselected memory cell MC2.

The turn-off voltage Voff may be a voltage that turns off the transistor and stops current from flowing through a semiconductor layer 122*a* of the transistor included in the selected memory cell MC1. That is, the semiconductor layer 122*a* of the transistor included in the selected memory cell MC1 may be in a current-off state. When the semiconductor layer 122*a* of the selected memory cell MC1 is in a current-off state, the semiconductor layer 122*a* may have insulator characteristics.

The turn-on voltage Von may be a voltage that turns on the transistor and allows current to flow through a semiconductor layer 122*b* of the transistor included in the unselected memory cell MC2. When the semiconductor layer 122*b* is in a current-on state, the semiconductor layer 122*b* may have conductor characteristics. That is, the semiconductor layer 122*b* of the transistor included in the unselected memory cell MC2 may be in a current-on state. When the semiconductor layer 122*b* is in a current-on state, the semiconductor layer 122*b* may have conductor characteristics. Accordingly, the semiconductor layer 122*a* corresponding to the selected memory cell MC1 may have insulator characteristics, and the semiconductor layer 122*b* corresponding to the unselected memory cell MC2 may have conductor characteristics.

The turn-off voltage Voff and the turn-on voltage Von may vary according to the types, thicknesses, etc., of the materials constituting the resistance change layer 124, the internal resistance layer 123, the semiconductor layer 122, the gate insulating layer 121, and the gate electrode 131. For example, the turn-off voltage Voff may be about −10 V to about −2 V. The turn-on voltage Von may be about 0 V to about 10 V. The turn-on voltage Von of the same value may be applied or the turn-on voltages Von of different values may be applied to the unselected memory cell MC2.

Because the absolute value of a voltage applied to the gate electrode 131 of the variable resistance memory device 100 is as small as 10 V or less, the interference effect between the memory cells may be suppressed. Accordingly, the height of the memory cell in the vertical direction may be reduced and thus the integration density thereof may be improved.

When a write voltage is applied between the common source area 110 and the drain 140, a current path may be formed as indicated by an arrow and accordingly the resistance of a resistance change layer 124*a* may change. This change in resistance allows information to be stored in the resistance change layer 124*a*. The resistance chance in the resistance change layer 124*a* may occur because, when a current flows through the resistance change layer 124*a*, oxygen vacancies or the like may be formed and the oxygen vacancies may be gathered to form a conductive filament. The conductive filament having a low resistance due to the oxygen vacancies formed therein, may cause the resistance change layer 124*a* to be in a low-resistance state.

The resistance change layer 124*a* may experience an overshoot phenomenon due to an overcurrent and/or an overvoltage at the moment when the resistance change layer 124*a* changes from a high-resistance state to a low-resistance state. The overcurrent and/or the overvoltage may permanently damage the resistance change layer 124 or may degrade the durability thereof. In order to overcome this limitation, an overcurrent may be prevented by adding a circuit to the variable resistance memory device 100 and setting a current limit (e.g., a compliance current). An overvoltage may be prevented by adding an external resistance component to the resistance change layer 124 and distributing a voltage between the external resistance component and the resistance change layer 124. However, the addition of a circuit or an external resistance component may lead to problems in the integration degree, power consumption, and logic driving of the variable resistance memory device 100.

The variable resistance memory device 100 according to an embodiment may include an internal resistance layer 123 to prevent an overcurrent and/or an overvoltage. The thickness of the internal resistance layer 123 may be less than the thickness of the resistance change layer 124. The thickness of the internal resistance layer 123 may about 1 nm to about 10 nm.

The resistance of the internal resistance layer 123 may be greater than the resistance of the semiconductor layer 122 when the semiconductor layer 122 has conductor characteristics and may be less than the resistance of the semiconductor layer 122 when the semiconductor layer 122 has insulator characteristics. The resistance of the internal resistance layer 123 may be about 0.35 MΩ to about 300 MΩ. The above resistance value of the internal resistance layer 123 may be a conversion value assuming a case where an allowable current for the semiconductor layer 122 with conductor characteristics is set to 17 μA, an allowable current for the semiconductor layer 122 with insulator characteristics is set to 10 A, and a voltage of 6 V is applied to the semiconductor layer 122. The required resistance value of the internal resistance layer 123 may vary according to the design of the variable resistance memory device 100.

The resistance of the internal resistance layer 123 may remain constant even when the resistance change layer 124 transitions from a high-resistance state to a low-resistance state. When an operation voltage is applied to the variable resistance memory device 100 and thus the resistance change layer 124 transitions from a high-resistance state to a low-resistance state, an operation voltage may be divided and applied between the resistance change layer 124 and the internal resistance layer 123, which are connected in series to each other. Accordingly, the resistance change layer 124 may be protected from an overcurrent and thus the degradation of the resistance change layer 124 may be prevented.

The absolute value of an operation voltage, for example, a write voltage or an erase voltage, of the variable resistance memory device 100 according to an embodiment may be about 6 V or less. However, the disclosure is not limited thereto. When oxygen vacancies are easily generated in the resistance change layer 124, the operation voltage may be about 4 V or less or about 2 V or less.

The resistance change layer 124 may include an oxide in which oxygen vacancies are easily generated. The internal resistance layer 123 may include an oxide in which oxygen vacancies are not easily generated. In order to commercialize the variable resistance memory device 100, a resistance difference may be great between the high-resistance state and the low-resistance state of the resistance change layer 124, and for this purpose, oxygen vacancies may be easily generated in the resistance change layer 124. Particularly, in order to prevent the degradation of the semiconductor layer 122 by reducing the absolute value of an operation voltage (e.g., a write voltage or an erase voltage) applied to the variable resistance memory device 100, oxygen vacancies may be easily generated in the resistance change layer 124.

On the other hand, the internal resistance layer 123 may include an oxide in which oxygen vacancies are not easily generated. Because the internal resistance layer 123 is not a memory area and is intended to prevent an overcurrent in the resistance change layer 124, oxygen vacancies may not be generated therein. In other words, the oxygen deficient ratio of the internal resistance layer 123 may be less than the oxygen deficient ratio of the resistance change layer 124. For example, the oxygen deficient ratio of the internal resistance layer 123 may be less than about 10% and the oxygen deficient ratio of the resistance change layer 124 may be about 10% or more.

The resistance change layer 124 may include a metal oxide with a high oxygen deficient ratio. For example, the resistance change layer 124 may include an oxide with an oxygen deficient ratio of 10% or more. The oxygen deficient ratio may be defined as in Equation (1) below.

$$\text{Oxygen Deficient Ratio} = \frac{((M1*0.5+M2*1.0+M3*1.5+M4*2.0+M5*2.5)-O)}{M1*0.5+M2*1.0+M3*1.5+M4*2.0+M5*2.5} \tag{1}$$

M1, M2, M3, M4, M5, and O are respectively a monovalent metal element content, a divalent metal element content, a trivalent metal element content, a tetravalent metal element content, a pentavalent metal element content, and an oxygen content.

A high oxygen deficient ratio may indicate that there are fewer oxygen ions than metal cations, and a metal oxide with a high oxygen deficient ratio may have a high oxygen vacancy content. When there are a large number of oxygen vacancies in the resistance change layer 124, because the resistance state of the resistance change layer 124 may change easily, the characteristics of the variable resistance memory device 100 may be improved. Also, when there are a large number of oxygen vacancies, because a conductive filament is easily formed when a voltage is applied thereto, a forming voltage may decrease and thus an operation voltage of the variable resistance memory device 100 may also decrease.

The resistance change layer 124 may include an oxide including at least one of tantalum (Ta), titanium (Ti), stannum (Sn), chromium (Cr), and manganese (Mn). For example, a binary metal oxide included in the resistance change layer 124 may include at least one of tantalum oxide (TaOx), titanium oxide (TiOx), stannum oxide (SnOx), chromium oxide (CrOx), and manganese oxide (MnOx).

The resistance change layer 124 may include a ternary metal oxide. For example, the resistance change layer 124 may include a first metal element, a second metal element, and an oxygen element that are different from each other. In the metal oxide, the content of the first metal element may be greater than the content of the second metal element. For example, the content of the first metal element with respect to the entire metal in the resistance change layer 124 may be about 50 at % or more, and the content of the second metal element with respect to the entire metal in the resistance change layer 124 may be less than about 35 at %. The first metal element may include one of tantalum (Ta), titanium (Ti), stannum (Sn), chromium (Cr), and manganese (Mn), and the second metal element may include one of hafnium (Hf), aluminum (Al), niobium (Nb), lanthanum (La), zirconium (Zr), scandium (Sc), tungsten (W), vanadium (V), and molybdenum (Mo).

Alternatively, the resistance change layer 124 may include a metal element, a silicon element, and an oxygen element. In the resistance change layer 124, the content of the metal element may be greater than the content of the silicon element. The content of the metal element with respect to the sum of the metal element and the silicon element in the resistance change layer 124 may be about 50 at % or more, and the content of the silicon element with respect to the sum of the metal element and the silicon element in the resistance change layer 124 may be less than about 35 at %. The metal element may include one of tantalum (Ta), titanium (Ti), stannum (Sn), chromium (Cr), and manganese (Mn).

Alternatively, the resistance change layer 124 may include a first metal oxide with an oxygen deficient ratio of about 10% or more and a second metal oxide with an oxygen deficient ratio of less than about 10%. The content of the first metal oxide may be greater than the content of the second metal oxide. The content of the metal included in the first metal oxide with respect to the entire metal included in the resistance change layer 124 may be about 50 at % or more, and the content of the metal included in the second metal oxide with respect to the entire metal included in the resistance change layer 124 may be less than about 35 at %. The first metal oxide may include at least one of tantalum oxide (TaOx), titanium oxide (TiOx), stannum oxide (SnOx), chromium oxide (CrOx), and manganese oxide (MnOx). The second metal oxide may include at least one of hafnium oxide (HfOx), aluminum oxide (AlOx), silicon oxide (SiOx), niobium oxide (NbOx), lanthanum oxide (LaOx), zirconium oxide (ZrOx), scandium oxide (ScOx), tungsten oxide (WOx), vanadium oxide (VOx), and molybdenum oxide (MoOx).

Moreover, the internal resistance layer 123 according to an embodiment may include an oxide in which oxygen vacancies are not easily generated. The oxygen deficient ratio of the internal resistance layer 123 may be less than about 10%.

The internal resistance layer 123 may include an oxide including at least one of hafnium (Hf), aluminum (Al), silicon (Si), niobium (Nb), lanthanum (La), zirconium (Zr), scandium (Sc), tungsten (W), vanadium (V), and molybdenum (Mo).

The internal resistance layer 123 may include a ternary metal oxide. For example, the internal resistance layer 123 may include a first element, a second element, and an oxygen element that are different from each other. The first element may be one of tantalum (Ta), titanium (Ti), stannum (Sn), chromium (Cr), and manganese (Mn), and the second element may be one of hafnium (Hf), aluminum (Al), niobium (Nb), lanthanum (La), zirconium (Zr), scandium (Sc), tungsten (W), vanadium (V), and molybdenum (Mo).

Both the first element and the second element may also be included in the resistance change layer 124. The contents of the first element and the second element may be different from each other in the internal resistance layer 123 and the resistance change layer 124. In the case of being combined with oxygen, when the second element with a low oxygen deficient ratio is included in both the internal resistance layer 123 and the resistance change layer 124, the content of the second element in the internal resistance layer 123 may be greater than the content of the second element in the resistance change layer 124. In the case of being combined with oxygen, when the first element with a high oxygen deficient ratio is included in both the internal resistance layer 123 and the resistance change layer 124, the content of the first element in the internal resistance layer 123 may be less than the content of the second element in the resistance change layer 124.

Because the internal resistance layer 123 and the resistance change layer 124 include the same element components, a lattice mismatch between the internal resistance layer 123 and the resistance change layer 124 may be mitigated. Accordingly, the variable resistance memory device 100 may be easily manufactured and the durability thereof may be improved. By setting the contents of the elements included in the internal resistance layer 123 and the resistance change layer 124 to be different, the resistance state of the internal resistance layer 123 may not change even at an operation voltage and the resistance state of the resistance change layer 124 may change at an operation voltage.

Figure 6:
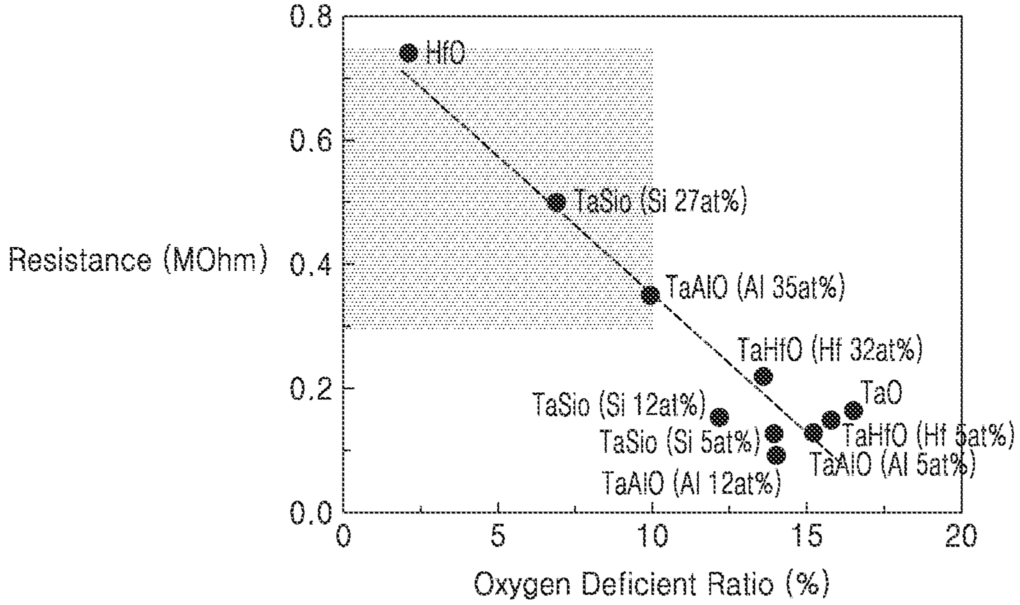
FIG. 6 is a graph illustrating the relationship between the oxygen deficient ratio and the resistance of the oxide of FIG. 5 according to an embodiment.

FIG. 5 is a table illustrating the relationship between the oxygen deficient ratio and the resistance of an oxide according to an embodiment. FIG. 6 is a graph illustrating the relationship between the oxygen deficient ratio and the resistance of the oxide of FIG. 5 according to an embodiment.

Referring to FIGS. 5 and 6, the oxygen deficient ratio of the oxide and the resistance of the oxide may be generally inversely proportional to each other. Particularly, the oxygen deficient ratio and the resistance of the oxide with an oxygen deficient ratio of less than about 10% may be linearly inversely proportional to each other.

Referring to FIGS. 5 and 6, hafnium oxide (HfOx), which is binary, may have a low oxygen deficient ratio of about 2.1% and a high resistance of about 0.74 MΩ. Hafnium oxide may have a high resistance and thus may be used as the internal resistance layer 123 according to an embodiment.

Moreover, tantalum oxide (TaOx) may have a high oxygen deficient ratio of about 16.5% and a low resistance of about 0.165 MΩ. It may be expected that the variable resistance memory device 100 may be implemented with a low operation voltage when tantalum oxide (TaOx) is used as a material for the resistance change layer 124 according to an embodiment.

The oxygen deficient ratio and the resistance may vary according to the type of the material included in the oxide. For example, tantalum silicon oxide (TaSiO(Si12at %)) having a silicon content of 12 at % with respect to the sum of tantalum and silicon may have an oxygen deficient ratio of about 12.13% and a resistance of about 0.155 MQ, whereas tantalum aluminum oxide (TaAlO(Al12at %)) having an aluminum content of 12 at % with respect to the sum of tantalum and aluminum may have an oxygen deficient ratio of about 13.93% and a resistance of about 0.095 MΩ.

The internal resistance layer 123 and the resistance change layer 124 may have different element composition ratios even when they have the same element components. For example, the resistance of tantalum aluminum oxide (TaAlO(Al5at %)) having an aluminum content of 5 at % with respect to the sum of tantalum and aluminum may be about 0.13 MΨ, and the resistance of tantalum aluminum oxide (TaAlO(Al35at %)) having an aluminum content of 35 at % with respect to the sum of tantalum and aluminum may be about 0.35 MQ. TaAlO(Al35at %) may be used as the internal resistance layer 123, and TaAlO(Al5at %) may be used as the resistance change layer 124. Alternatively, the resistance of tantalum silicon oxide (TaSiO(Si5at %)) having a silicon content of 5 at % with respect to the sum of tantalum and silicon may be about 0.128 MΩ, and the resistance of tantalum silicon oxide (TaSiO(Si27at %)) having a silicon content of 27 at % with respect to the sum of tantalum and silicon may be about 0.5 MΩ. TaSiO(Si27at %) may be used as the internal resistance layer 123, and TaSiO(Si5at %) may be used as the resistance change layer 124.

In the variable resistance memory device 100 according to an embodiment, the pitch between the gate electrodes 131 may be minimized by using the resistance change layer 124 with a high oxygen deficient ratio. In the case of an embodiment, this length may be reduced to about 20 nm or less (e.g., to about 15 nm), and in this case, the memory capacity thereof may be improved by two times or more.

As such, the variable resistance memory device 100 may solve a scaling issue between the memory cells in the VNAND and thus may increase the integration degree (density) and may implement low power consumption.

Even when the resistance change layer 124 includes a material with a high oxygen deficient ratio, because the internal resistance layer 123 is arranged between the semiconductor layer 122 and the resistance change layer 124, an overcurrent and/or an overvoltage may be prevented from being applied to the resistance change layer 124.

FIGS. 7A, 7B, 7C, 7D, 7E, 7F and 7G are diagrams illustrating a method of manufacturing a variable resistance memory device according to an embodiment.

Figure 7A:
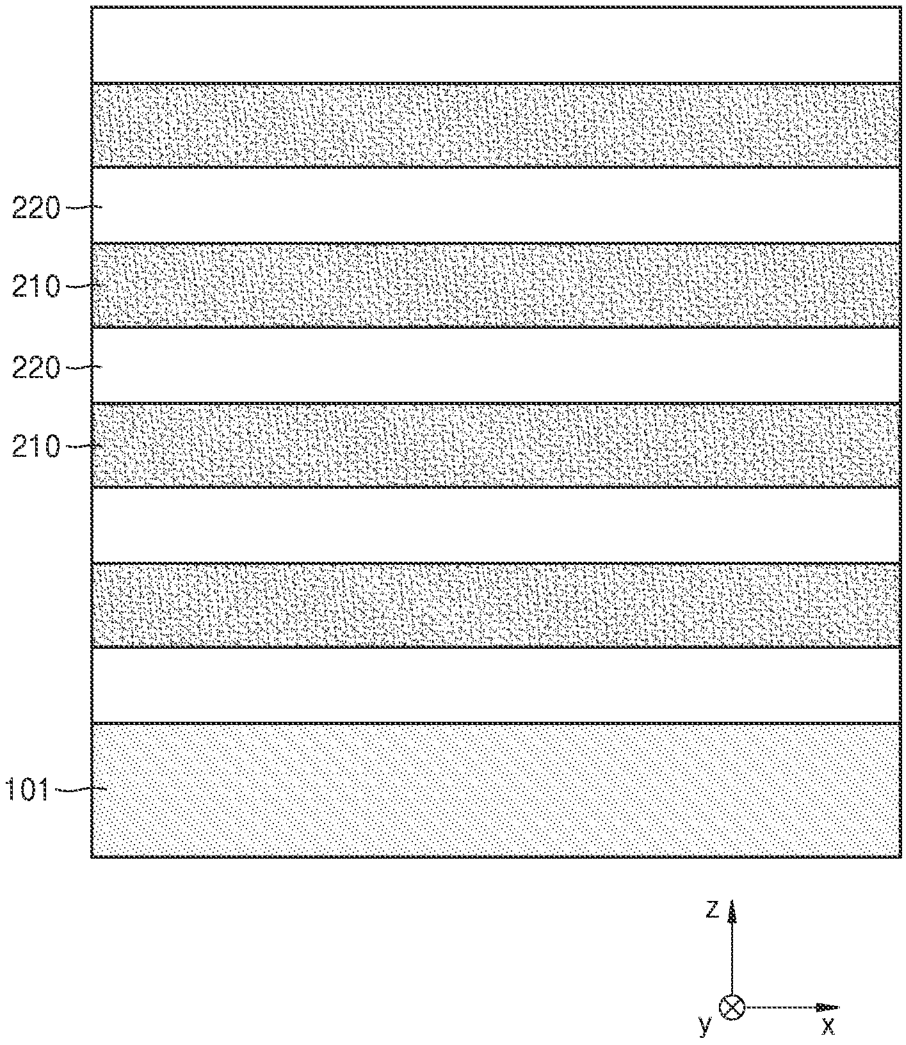
FIGS. 7A, 7B, 7C, 7D, 7E, 7F and 7G are diagrams illustrating a method of manufacturing a variable resistance memory device according to an embodiment.

As illustrated in FIG. 7A, a first insulating material layer 210 and a second insulating material layer 220 may be alternately stacked over a substrate 101. The first insulating material layer 210 and the second insulating material layer 220 may be alternately stacked in a direction perpendicular or substantially perpendicular to the surface of the substrate 101. The first and second insulating material layers 210 and 220 may include different materials. The first and second insulating material layers 210 and 220 may include, for example, silicon oxide or silicon nitride but are not limited thereto.

Figure 7B:
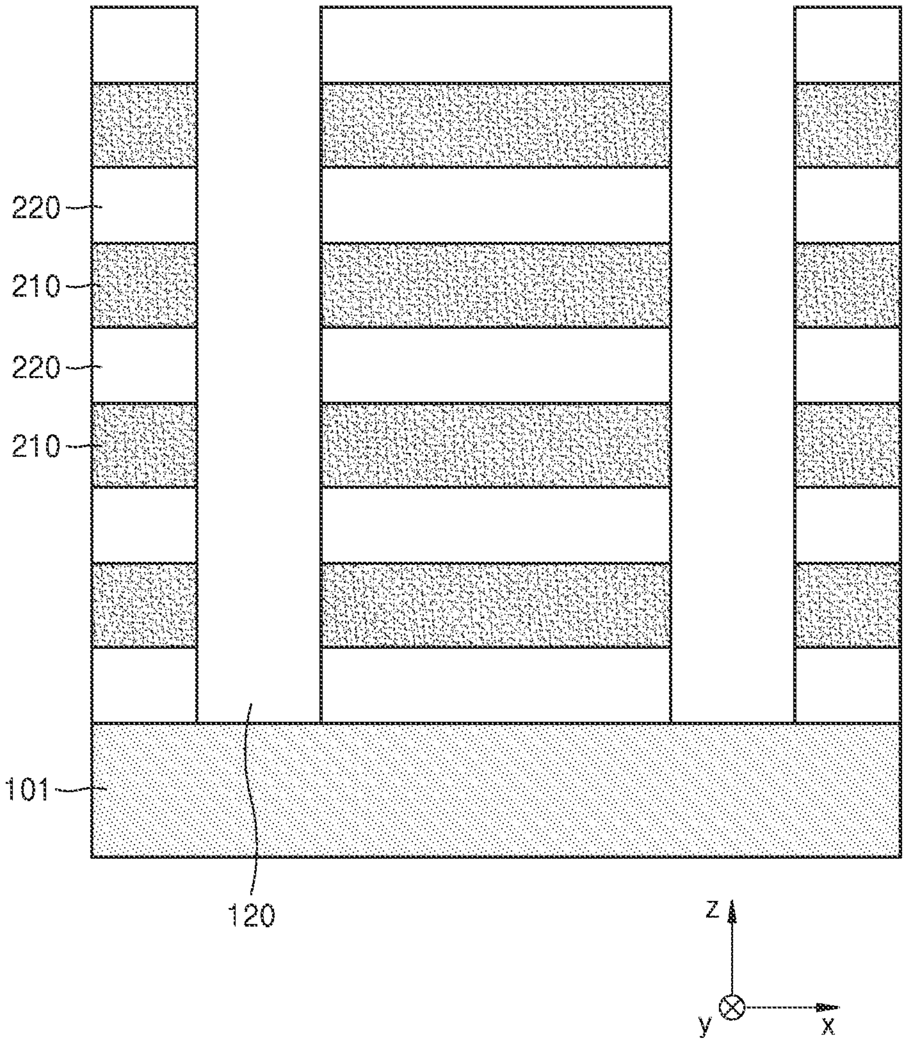

As illustrated in FIG. 7B, a channel hole 120 may be formed to pass through the first and second insulating material layers 210 and 220. The channel hole 120 may be formed to extend in a direction perpendicular or substantially perpendicular to the surface of the substrate 101. The channel hole 120 may be formed to have a circular cross-section. The channel hole 120 may be formed by anisotropically etching the first insulating material layer 210 and the second insulating material layer 220. The surface of the substrate 101 may be exposed through the channel hole 120.

Figure 7C:
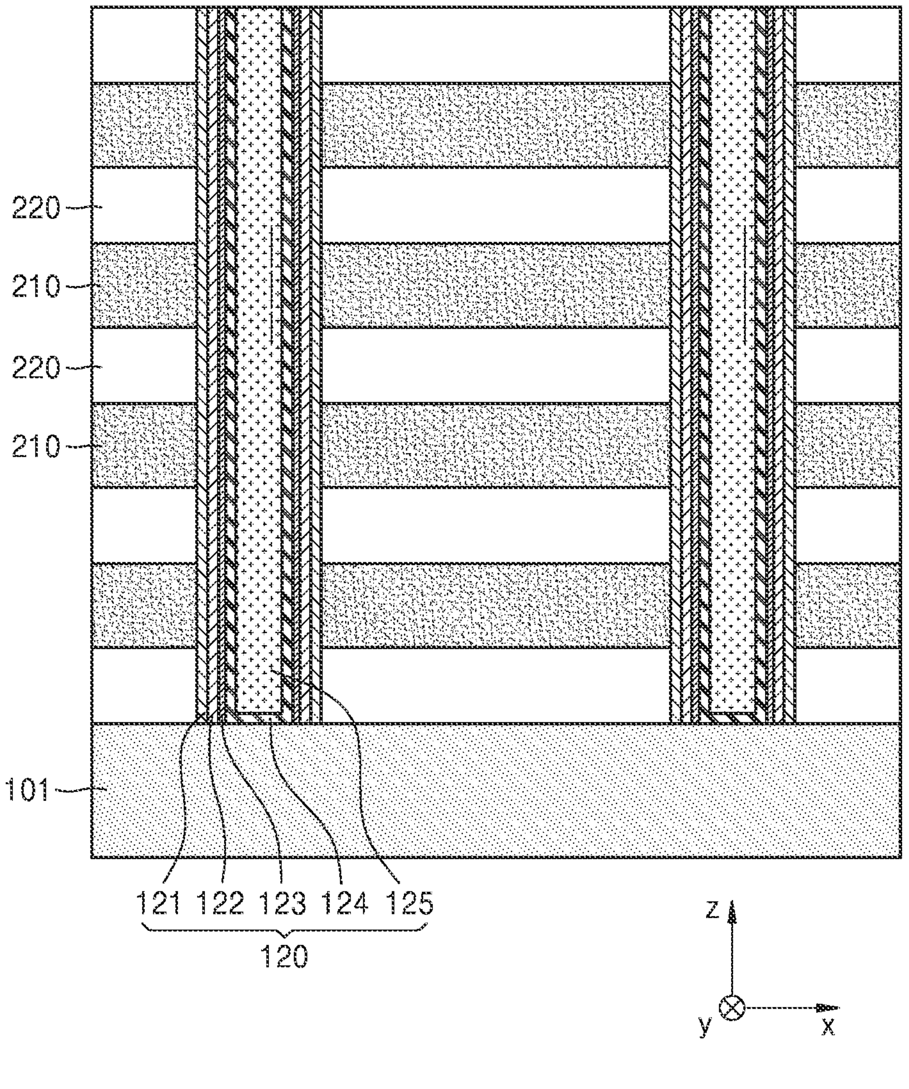

As illustrated in FIG. 7C, a gate insulating layer 121, a semiconductor layer 122, an internal resistance layer 123, a resistance change layer 124, and a pillar 125 may be sequentially formed on the inner wall of the channel hole 120. The gate insulating layer 121 may be formed to extend in a direction perpendicular or substantially perpendicular to the surface of the substrate 101. The gate insulating layer 121 may be formed on the inner wall of the channel hole 120 to contact the first and second insulating material layers 210 and 220. The semiconductor layer 122 may be formed to contact the inner side surface of the gate insulating layer 121. The internal resistance layer 123 may be formed to contact the inner side surface of the semiconductor layer 122. The resistance change layer 124 may be formed on the inner side surface of the internal resistance layer 123 and the upper surface of the substrate 101 exposed by the channel hole 120. A pillar 125 may be further formed inside the resistance change layer 124. FIG. 7C illustrates that the pillar 125 is formed. However, the disclosure is not limited thereto. The pillar 125 may be formed together during the formation of a gate electrode 131 described below.

Figure 7D:
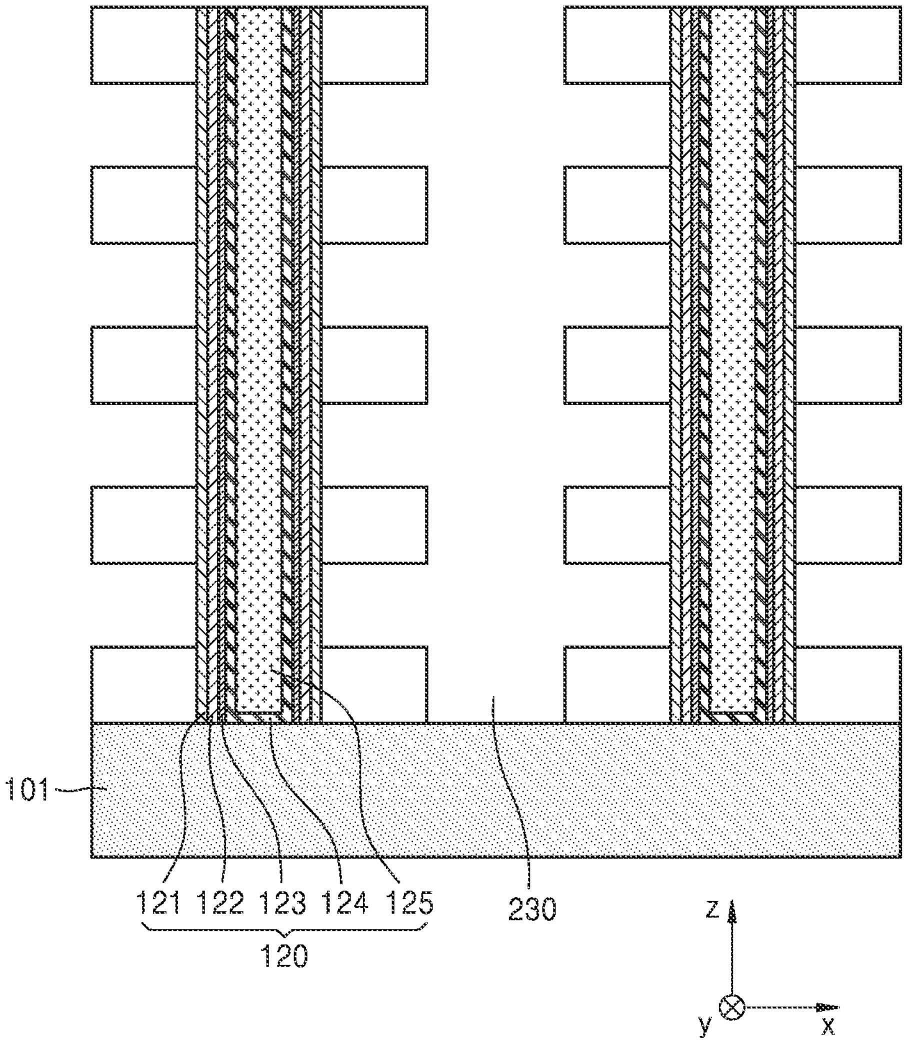

As illustrated in FIG. 7D, an opening 230 passing through the first and second insulating material layers 210 and 220 may be formed, and the gate insulating layer 121 may be exposed by removing the second insulating material layer 220. The second insulating material layer 220 may be etched by a wet etching process.

Figure 7E:
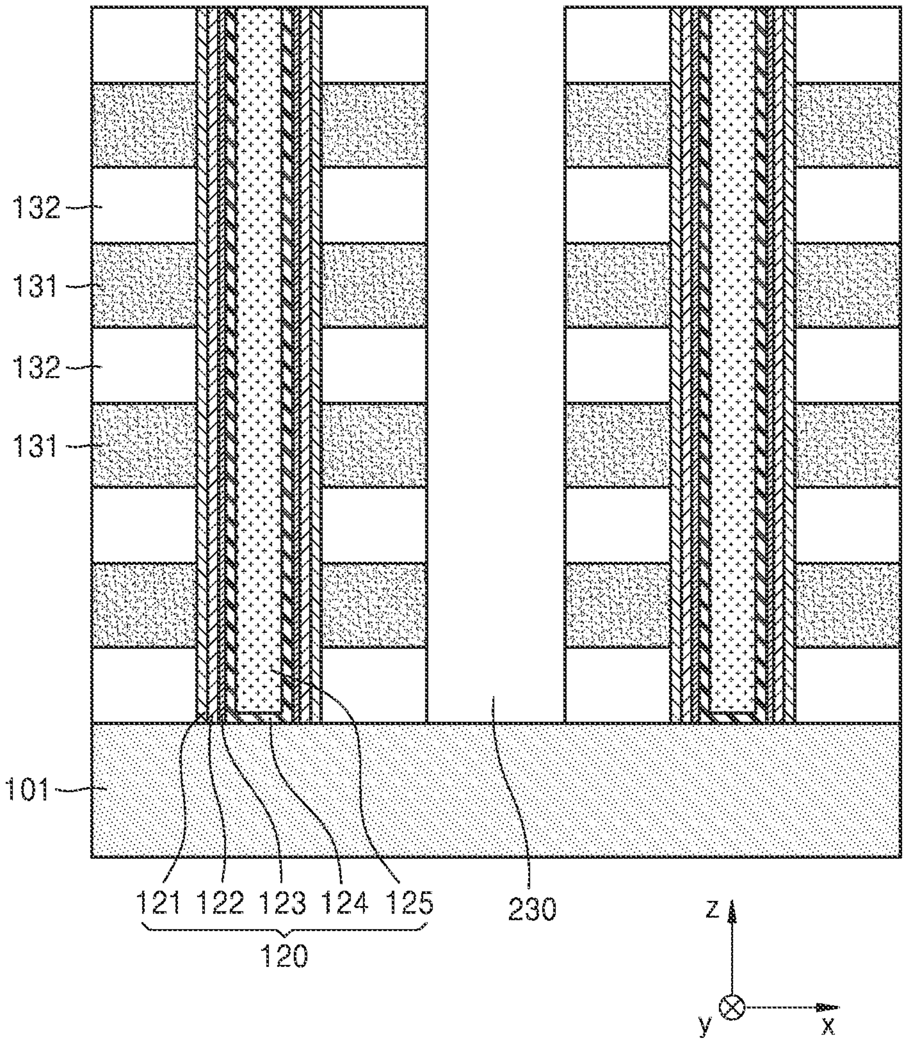

As illustrated in FIG. 7E, a gate electrode 131 may be formed in an area with the second insulating material layer 220 removed therefrom. The pillar 125 may also be formed together during the formation of the gate electrode 131. The first insulating material layer 210, which is unremoved, may function as an isolating layer 132. The pillar 125 may also be formed during the formation of the gate electrode 131.

Figure 7F:
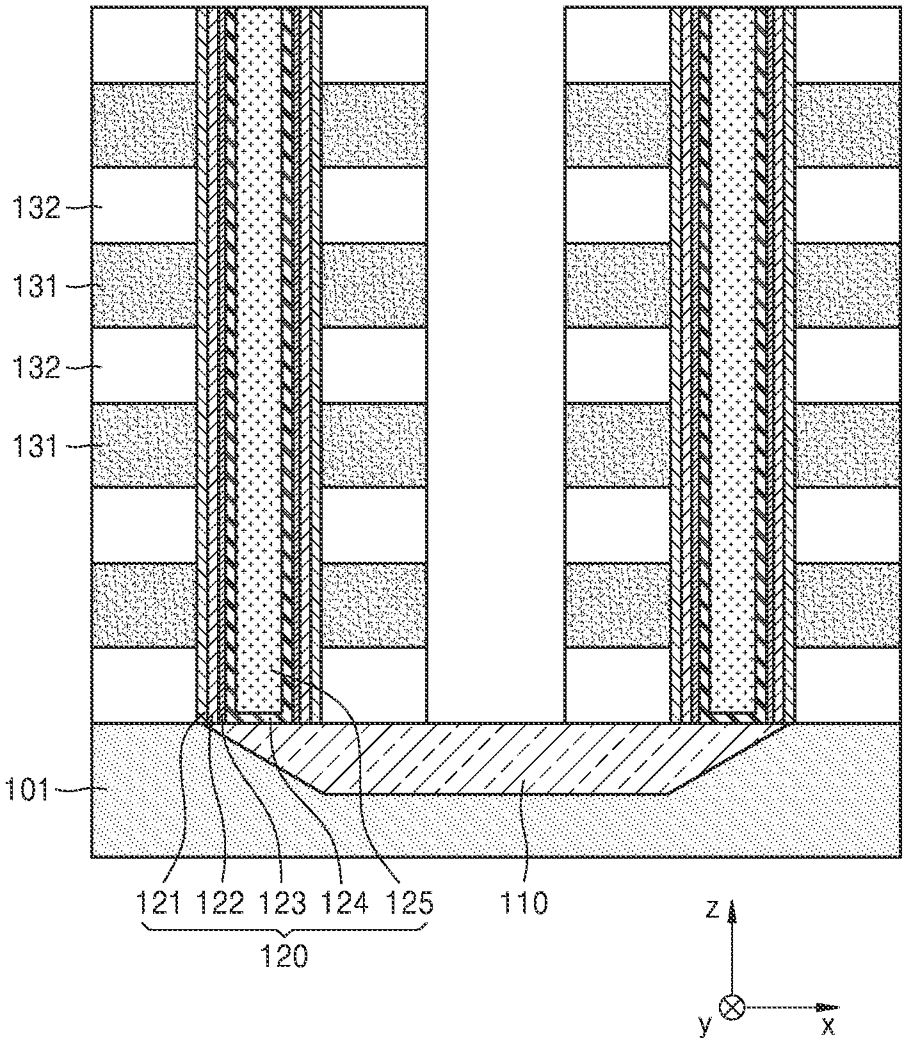

As illustrated in FIG. 7F, a common source area 110 may be formed over the substrate 101 exposed by the opening 230. The common source area 110 may be formed by doping with an n-type dopant such as phosphorus (P).

Figure 7G:
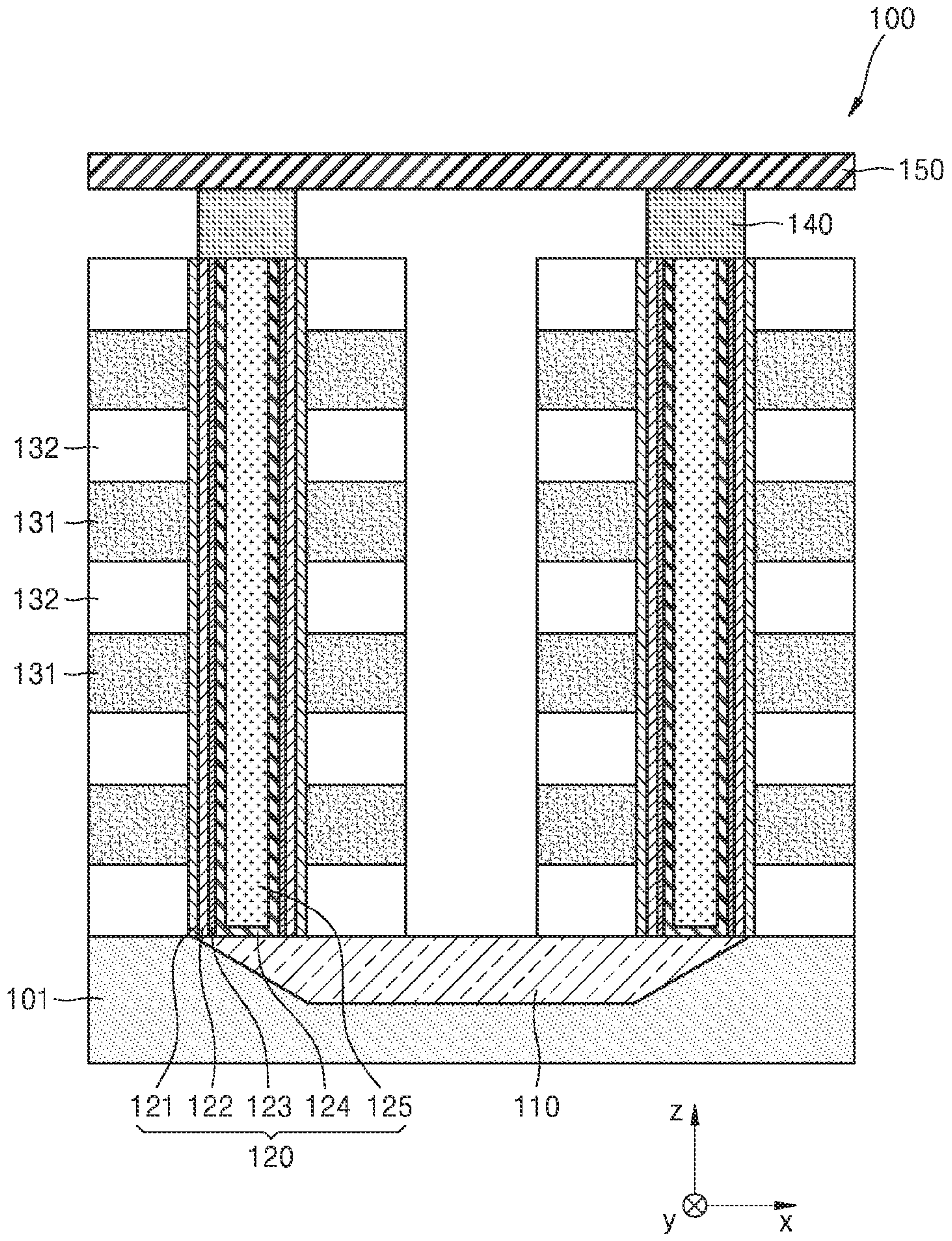

As illustrated in FIG. 7G, a drain 140 may be formed on the semiconductor layer 122, and a bit line 150 may be formed on the drain 140.

Figure 8:
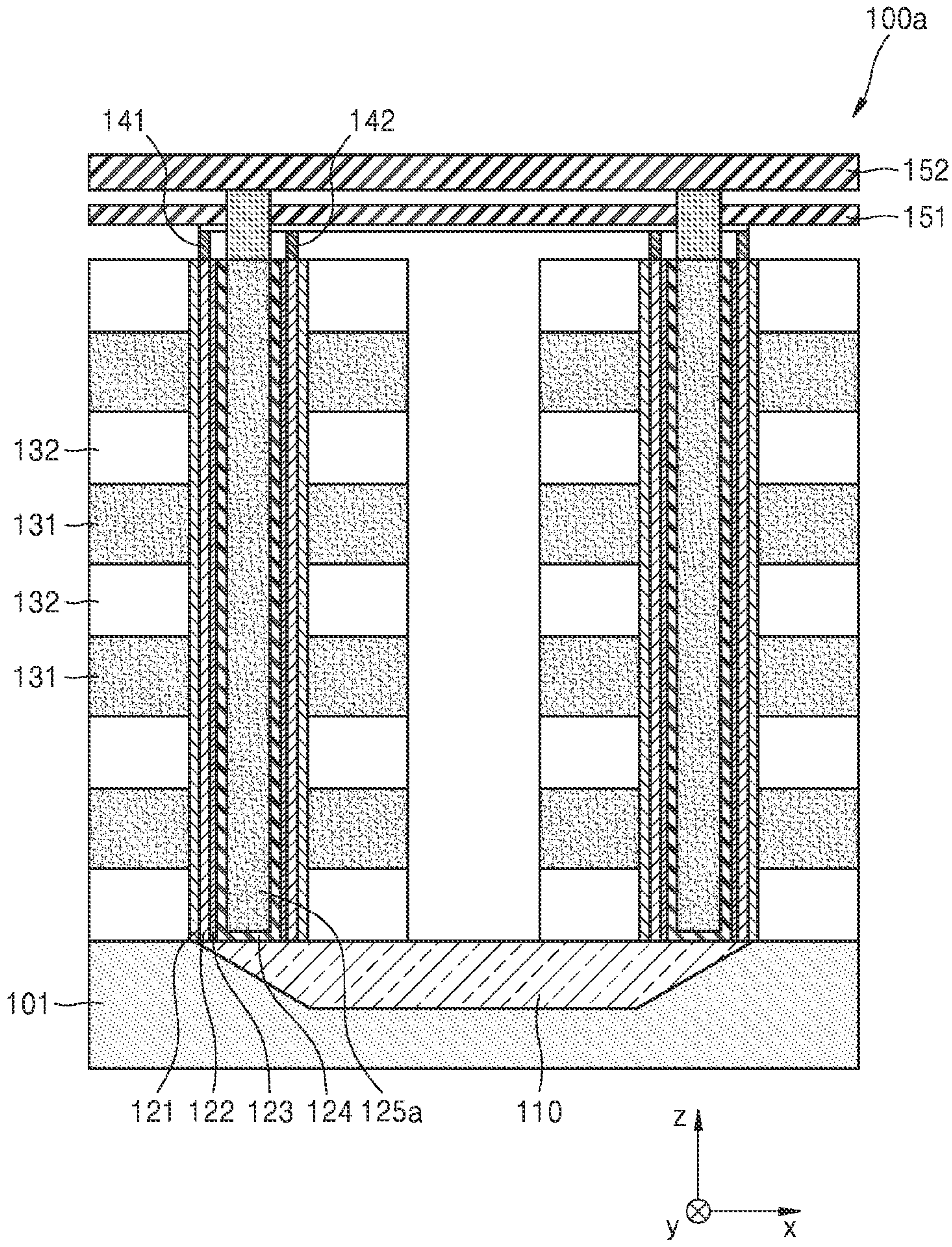
FIG. 8 is a diagram illustrating a variable resistance memory device including a conductive pillar according to an embodiment.

FIG. 8 is a diagram illustrating a variable resistance memory device 100*a* including a conductive pillar 125*a* according to an embodiment. Comparing FIG. 1 with FIG. 8, the variable resistance memory device 100*a* of FIG. 8 may include a conductive pillar 125*a* instead of the insulating pillar 125.

The conductive pillar 125*a* may contact the resistance change layer 124. The conductive pillar 125*a* may be conformally deposited on the resistance change layer 124. The conductive pillar 125*a* may include a material having excellent electrical conductivity. For example, the conductive pillar 125*a* may include at least one of W, Ti, TIN, Ru, $RuO_2$, Ta, and TaN. The conductive pillar 125*a* may include the same material as the gate electrode 131.

All areas of the conductive pillar 125*a* may be spaced apart from all areas of the semiconductor layer 122 by the resistance change layer 124. Because the conductive pillar 125*a* and the semiconductor layer 122 are electrically insulated from each other, a voltage may be independently applied to the conductive pillar 125*a* and the semiconductor layer 122.

A first drain 141 may be provided on the semiconductor layer 122, and a second drain 142 may be provided on the conductive pillar 125*a*. The first drain 141 and the second drain 142 may be electrically insulated from each other. For example, the first drain 141 and the second drain 142 may be spaced apart from each other, and the space between the first drain 141 and the second drain 142 may be filled with air or an insulating material.

At least one of the first drain 141 and the second drain 142 may include a second-type doped silicon material. For example, the first drain 141 and the second drain 142 may include an n-type doped silicon material.

A first bit line 151 may be provided to the first drain 141, and a second bit line 152 may be provided to the second drain 142. Each of the first drain 141 and the first bit line 151 and the second drain 142 and the second bit line 152 may be connected to each other through contact plugs. The first bit line 151 and the second bit line 152 may include a metal material. In one cell string, the first and second bit lines 151 and 152 may function as a bit line BL as a set.

When the variable resistance memory device 100*a* operates, a voltage may also be applied to the conductive pillar 125*a*. The voltage applied to the conductive pillar 125*a* may be higher than a gate voltage of a selected memory cell, that is, a turn-off voltage, and may be higher than or equal to a voltage applied to the semiconductor layer 122. Accordingly, an electric field in the horizontal direction toward the semiconductor layer 122 may be formed in the resistance change layer 124 corresponding to the selected memory cell. Because the oxygen vacancies in the resistance change layer 124 corresponding to the selected memory cell are concentrated in an area of the resistance change layer 124 close to the semiconductor layer 122, a conductive filament may be more easily formed.

The variable resistance memory device 100 including the internal resistance layer 123 and the resistance change layer 124 according to an embodiment may be applied to various electronic apparatuses such as display apparatuses and memory apparatuses.

Figure 9:
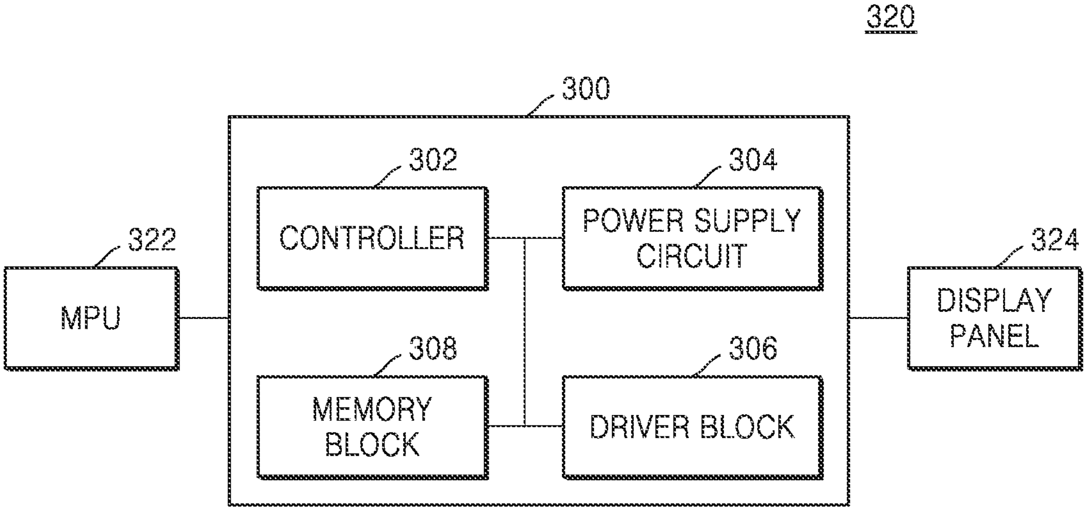
FIG. 9 is a diagram illustrating a display driver integrated circuit (IC) (DDI) and a display apparatus including the DDI according to an embodiment.

FIG. 9 is a diagram illustrating a display driver integrated circuit (IC) (DDI) 300 and a display apparatus 320 including the DDI 300 according to an embodiment. Referring to FIG. 9, the DDI 300 may include a controller 302, a power supply circuit 304, a driver block 306, and a memory block 308. The controller 302 may receive and decode a command applied from a main processing unit (MPU) 322 and control each of the blocks of the DDI 300 to implement an operation according to the command. The power supply circuit 304 may generate a driving voltage in response to control by the controller 302. The driver block 306 may drive a display panel 324 by using the driving voltage generated by the power supply circuit 304 in response to the control by the controller 302. The display panel 324 may be, for example, a liquid crystal display panel, an organic light emitting device (OLED) display panel, or a plasma display panel. The memory block 308 may be a block for temporarily storing commands input to the controller 302 or control signals output from the controller 302 or storing necessary data and may include a memory such as a RAM and/or a ROM. For example, the memory block 308 may include the variable resistance memory device 100 according to the above embodiments.

Figure 10:
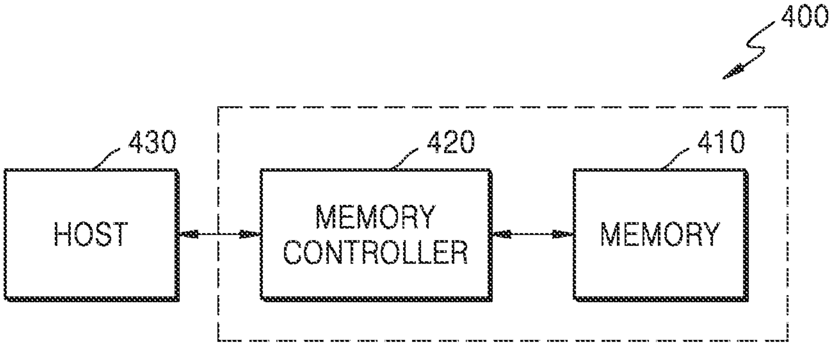
FIG. 10 is a diagram illustrating an electronic apparatus according to an embodiment.

FIG. 10 is a diagram illustrating an electronic apparatus 400 according to an embodiment. Referring to FIG. 10, the electronic apparatus 400 may include a memory 410 and a memory controller 420. The memory controller 420 may control the memory 410 to read data from the memory 410 and/or write data into the memory 410 in response to a request from a host 430. The memory 410 may include the variable resistance memory devices 100 and 100*a* according to the above embodiments.

Figure 11:
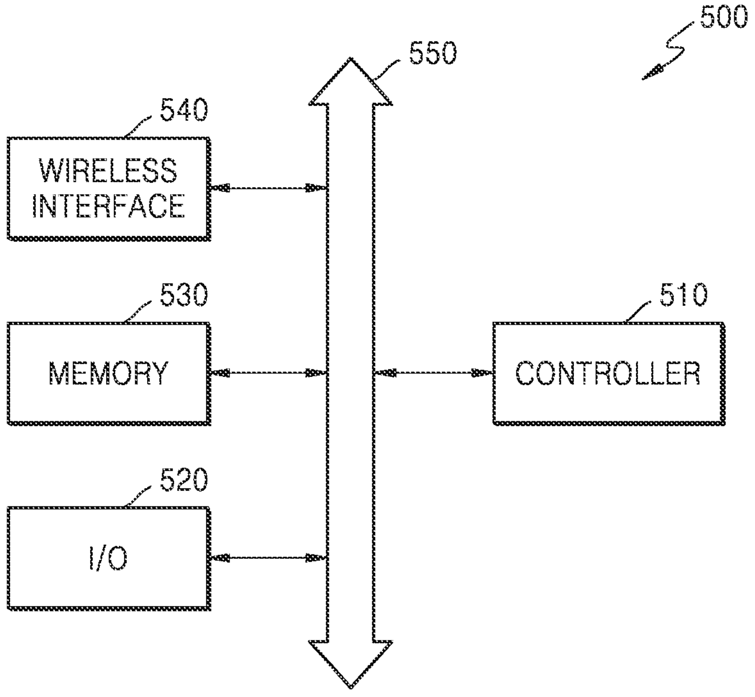
FIG. 11 is a diagram illustrating an electronic apparatus according to an embodiment.

FIG. 11 is a diagram illustrating an electronic apparatus 500 according to an embodiment. Referring to FIG. 11, the electronic apparatus 500 may configure a wireless communication apparatus or an apparatus capable of transmitting and/or receiving information in a wireless environment. The electronic apparatus 500 may include a controller 510, an input/output (I/O) device 520, a memory 530, and a wireless interface 540, which may be connected to each other through a bus 550.

The controller 510 may include at least one of a microprocessor, a digital signal processor, and any similar processing device. The I/O device 520 may include at least one of a keypad, a keyboard, and a display. The memory 530 may be used to store a command executed by the controller 510. For example, the memory 530 may be used to store user data. The electronic apparatus 500 may use the wireless interface 540 to transmit/receive data through a wireless communication network. The wireless interface 540 may include an antenna and/or a wireless transceiver. In some embodiments, the electronic apparatus 500 may be used in the communication interface protocols of third-generation communication systems such as Code Division Multiple Access (CDMA), Global System for Mobile Communications (GSM), North American Digital Cellular (NADC), Extended Time Division Multiple Access (E-TDMA), and/or Wideband Code Division Multiple Access (WCDMA). The memory 530 of the electronic apparatus 500 may include the memory device according to the above embodiments.

Figure 12:
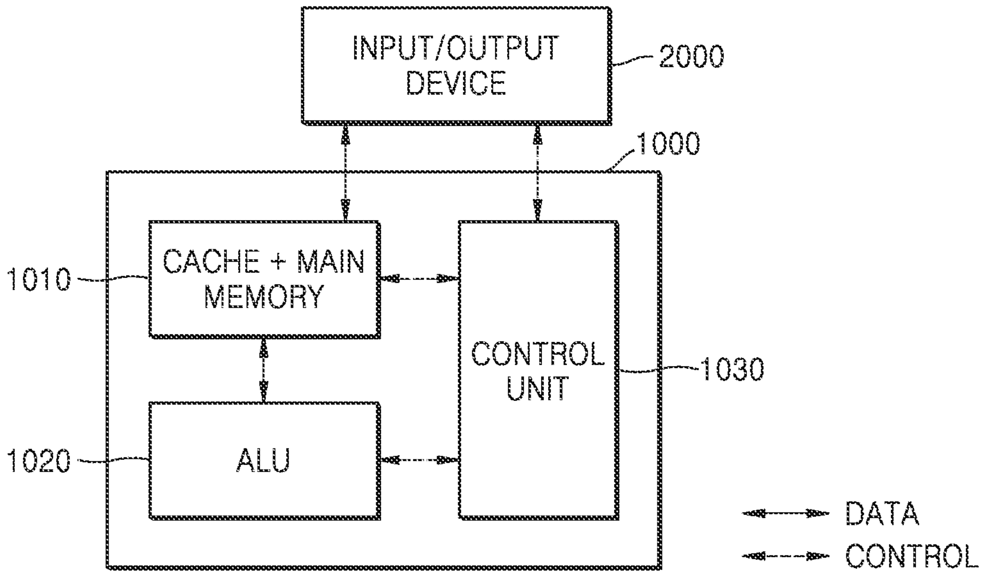
FIG. 12 is a diagram schematically illustrating a device architecture applicable to an electronic apparatus according to an embodiment.

FIG. 12 is a diagram schematically illustrating a device architecture applicable to an electronic apparatus according to an embodiment.

Referring to FIG. 12, an electronic device architecture 1000 may include a memory unit 1010 and a control unit 1030 and may further include an arithmetic logic unit (ALU) 1020. The memory unit 1010, the ALU 1020, and the control unit 1030 may be electrically connected to each other. For example, the electronic device architecture 1000 may be implemented as a single chip including the memory unit 1010, the ALU 1020, and the control unit 1030. Particularly, the memory unit 1010, the ALU 1020, and the control unit 1030 may be connected to each other through a metal line on-chip to directly communicate with each other. The memory unit 1010, the ALU 1020, and the control unit 1030 may be monolithically integrated on one substrate 101 to constitute one chip. An I/O device 2000 may be connected to the electronic device architecture (chip) 1000. Also, the memory unit 1010 may include both a main memory and a cache memory. This electronic device architecture (chip) 1000 may be an on-chip memory processing unit. Each of the memory unit 1010, the ALU 1020, and/or the control unit 1030 may independently include the variable resistance memory device 100 according to the above embodiments.

Figure 13:
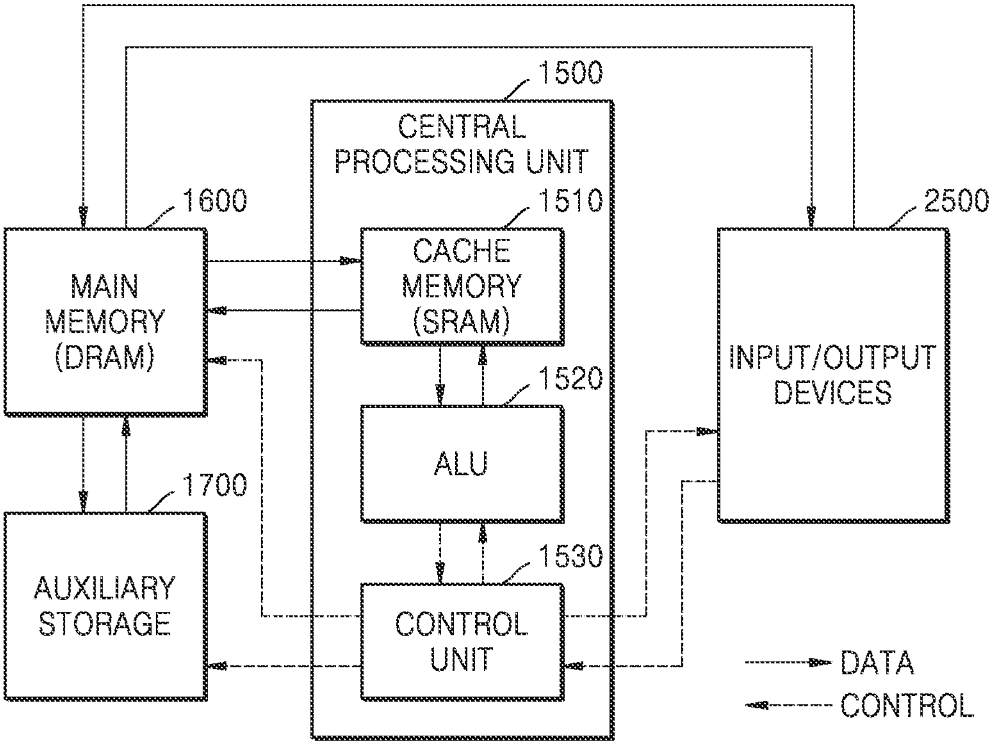
FIG. 13 is a diagram schematically illustrating a device architecture applicable to an electronic apparatus according to an embodiment.

FIG. 13 is a diagram schematically illustrating a device architecture applicable to an electronic apparatus according to an embodiment. Referring to FIG. 13, a cache memory 1510, an ALU 1520, and a control unit 1530 may constitute a central processing unit (CPU) 1500, and the cache memory 1510 may include a static random access memory (SRAM). Separately from the CPU 1500, a main memory 1600 and an auxiliary storage 1700 may be provided and an I/O device 2500 may also be provided. The main memory 1600 may be, for example, a dynamic random access memory (DRAM)

and may include the variable resistance memory device 100 according to the above embodiments.

In some cases, the electronic device architecture may be implemented in a form in which computing unit devices and memory unit devices are adjacent to each other in one chip without distinction between subunits.

According to embodiments, an internal resistance layer may be included between a resistance change layer and a semiconductor layer. The internal resistance layer may have a resistance that is greater than the resistance of the semiconductor layer when the semiconductor layer has conductor characteristics and is less than the resistance of the semiconductor layer when the semiconductor layer has insulator characteristics. The internal resistance layer may be formed of a material that may not easily generate oxygen vacancies therein. For example, the internal resistance layer may be formed of an oxide with an oxygen deficient ratio of less than about 10%. The internal resistance layer and the resistance change layer may be formed of the same material, but the internal resistance layer may include more metal with a low oxygen deficient ratio than the resistance change layer.

The internal resistance layer included in the variable resistance memory device may prevent an overcurrent and an overvoltage from being applied to the resistance change layer.

Because the resistance change layer according to an embodiment includes a material capable of generating a lot of oxygen vacancies therein, the variable resistance memory device may be easily operated even when a voltage with a small absolute value is applied thereto.

Because the internal resistance layer and the resistance change layer include the same material, the variable resistance memory device may be easily manufactured and the durability thereof may be improved.

The variable resistance memory device according to an embodiment may easily implement low power consumption and high integration degree.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A variable resistance memory device comprising:
- a pillar;
- a resistance change layer provided at a side surface of the pillar;
- a semiconductor layer provided at a side surface of the resistance change layer;
- a gate insulating layer provided at a side surface of the semiconductor layer;
- a plurality of isolating layers and a plurality of gate electrodes alternately arranged along a surface of the gate insulating layer; and
- an internal resistance layer between the resistance change layer and the semiconductor layer,
- wherein a resistance of the internal resistance layer is greater than a resistance of the semiconductor layer when the semiconductor layer comprises conductor characteristics,
- wherein the resistance of the internal resistance layer is less than the resistance of the semiconductor layer when the semiconductor layer comprises insulator characteristics, and
- wherein the resistance of the internal resistance layer is 0.35 MΩ to 600 MΩ.

2. The variable resistance memory device of claim 1, wherein an oxygen deficient ratio of the internal resistance layer is less than an oxygen deficient ratio of the resistance change layer.

3. The variable resistance memory device of claim 1, wherein an oxygen deficient ratio of the internal resistance layer is less than 10%.

4. The variable resistance memory device of claim 1, wherein an oxygen deficient ratio of the resistance change layer is 10% or more.

5. The variable resistance memory device of claim 1, wherein the internal resistance layer comprises an oxide comprising at least one of hafnium (Hf), aluminum (Al), silicon (Si), niobium (Nb), lanthanum (La), zirconium (Zr), scandium (Sc), tungsten (W), vanadium (V), and molybdenum (Mo).

6. The variable resistance memory device of claim 1, wherein the resistance change layer comprises an oxide comprising at least one of tantalum (Ta), titanium (Ti), stannum (Sn), chromium (Cr), and manganese (Mn).

7. The variable resistance memory device of claim 1, wherein the internal resistance layer and the resistance change layer comprise a ternary metal oxide.

8. The variable resistance memory device of claim 1, wherein the internal resistance layer further comprises a second element at a third content, and
- wherein the resistance change layer comprises the second element at a fourth content different from the third content.

9. The variable resistance memory device of claim 8, wherein the second element comprises any one of tantalum (Ta), titanium (Ti), stannum (Sn), chromium (Cr), or manganese (Mn).

10. The variable resistance memory device of claim 8, wherein the third content of the second element in the internal resistance layer is less than the fourth content of the second element in the resistance change layer.

11. The variable resistance memory device of claim 1, wherein an operation voltage with an absolute value of 6 V or less is applied to the semiconductor layer.

12. The variable resistance memory device of claim 1, wherein a thickness of the internal resistance layer is less than a thickness of the resistance change layer.

13. The variable resistance memory device of claim 12, wherein the thickness of the internal resistance layer is 1 nm to 10 nm.

14. The variable resistance memory device of claim 1, wherein a pitch between the plurality of gate electrodes is 20 nm or less.

15. The variable resistance memory device of claim 1, wherein the pillar comprises an insulating material.

16. A variable resistance memory device comprising:
- a pillar;
- a resistance change layer provided at a side surface of the pillar;
- a semiconductor layer provided at a side surface of the resistance change layer;
- a gate insulating layer provided at a side surface of the semiconductor layer;

a plurality of isolating layers and a plurality of gate electrodes alternately arranged along a surface of the gate insulating layer; and an internal resistance layer between the resistance change layer and the semiconductor layer, wherein a resistance of the internal resistance layer is greater than a resistance of the semiconductor layer when the semiconductor layer comprises conductor characteristics, wherein the resistance of the internal resistance layer is less than the resistance of the semiconductor layer when the semiconductor layer comprises insulator characteristics, wherein the internal resistance layer comprises a first element at a first content, wherein the resistance change layer comprises the first element at a second content different from the first content, and wherein the first element comprises any one of hafnium (Hf), aluminum (Al), silicon (Si), niobium (Nb), lanthanum (La), zirconium (Zr), scandium (Sc), tungsten (W), vanadium (V), or molybdenum (Mo).

17. The variable resistance memory device of claim 16, wherein the first content of the first element in the internal resistance layer is greater than the second content of the first element in the resistance change layer.

18. A variable resistance memory device comprising:

a pillar;

a resistance change layer provided at a side surface of the pillar;

a semiconductor layer provided at a side surface of the resistance change layer;

a gate insulating layer provided at a side surface of the semiconductor layer;

a plurality of isolating layers and a plurality of gate electrodes alternately arranged along a surface of the gate insulating layer; and an internal resistance layer between the resistance change layer and the semiconductor layer, wherein a resistance of the internal resistance layer is greater than a resistance of the semiconductor layer when the semiconductor layer comprises conductor characteristics, wherein the resistance of the internal resistance layer is less than the resistance of the semiconductor layer when the semiconductor layer comprises insulator characteristics, and wherein the pillar comprises a conductive material.

* * * * *